(12) United States Patent
Schuelke

(10) Patent No.: US 6,222,470 B1
(45) Date of Patent: Apr. 24, 2001

(54) VOLTAGE/CURRENT REFERENCE WITH DIGITALLY PROGRAMMABLE TEMPERATURE COEFFICIENT

(75) Inventor: Robert John Schuelke, Lakeville, MN (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/404,640

(22) Filed: Sep. 23, 1999

(51) Int. Cl.[7] .................................................. H03M 1/06
(52) U.S. Cl. ................................. 341/119; 327/513
(58) Field of Search .................................. 341/119, 118, 341/120; 327/513, 538, 539, 277; 331/176

(56) References Cited

U.S. PATENT DOCUMENTS

| | | |
|---|---|---|
| 4,272,760 * | 6/1981 | Prazak et al. ................. 341/120 |
| 4,604,568 | 8/1986 | Prieto . |
| 4,746,879 | 5/1988 | Ma et al. . |
| 5,121,004 * | 6/1992 | Kesler et al. ................. 326/124 |
| 5,198,701 | 3/1993 | Davies et al. . |
| 5,281,906 | 1/1994 | Thelen, Jr. . |
| 5,334,929 | 8/1994 | Schade, Jr. . |
| 5,428,319 * | 6/1995 | Marvin et al. ................. 331/176 |
| 5,543,746 | 8/1996 | Kuo . |
| 5,640,085 | 6/1997 | Petr et al. . |
| 5,828,329 | 10/1998 | Burns . |
| 5,852,360 | 12/1998 | Levinson . |

* cited by examiner

Primary Examiner—Patrick Wamsley
(74) Attorney, Agent, or Firm—Gray Cary Ware Freidenrich

(57) ABSTRACT

A circuit yielding a precise, programmable, finite temperature coefficient, in the form of either current or voltage, has been provided. Temperature independent and temperature dependent currents are manipulated through the use of digital to analog converters (DACs), with the sum of these currents representing the desired coefficient. The DACs are digitally programmable to provide the exact current required to meet a predetermined temperature coefficient. Electrical components requiring temperature compensation can be precisely controlled by supplying current at a known, predetermined temperature coefficient. A method of digitally programming a current or voltage having a predetermined finite temperature coefficient has also been provided.

22 Claims, 5 Drawing Sheets

VOLTAGE/CURRENT REFERENCE WITH DIGITALLY PROGRAMMABLE TEMPERATURE COEFFICIENT

BACKGROUND AND SUMMARY OF THE INVENTION

This invention relates generally to compensating electrical circuits for temperature variation and, more particularly, to a system and method of digitally programming currents and voltages that follow a predefined finite temperature coefficient.

Most electrical components use parts having transistor or diodes junctions which have a current/voltage relationship that varies with respect to temperature. Changes in either voltage or current increase the uncertainties at electrical interfaces, and may degrade the performance of circuits. Even though the principles of these temperature dependent current/voltage relationship are well understood, solutions are not always simple due to lot variations in electrical parts, or a limited amount of resources available for temperature compensation. Other parts used in electrical circuits, besides transistors, are subject to performance variations in response to temperature. Examples of components requiring temperature compensation include optoelectronic components (e.g., laser diodes), physical sensors (e.g., pressure sensors), to name but a few.

As current and voltage references comprise a basic and fundamental building block of electronic systems, there consequentially exists a significant amount of prior art. Most prior art circuits describe references that strive to provide currents and voltages that are independent of temperature. However, a small subset of these previous inventions also includes disclosures of references with variable temperature characteristics.

Compensating for temperature characteristics allows the stable operation of electronic components over variations in temperature. Temperature compensation becomes even more critical in circuits requiring a high level of integration, or rapid, low cost, highly reproducible implementation. One of the problems associated with building circuits which compensate for temperature variations, is that temperature compensation circuits themselves are subject to temperature related performance changes.

Digital circuitry has been used in some temperature compensation circuits to provide a constant, or predetermined output, so as to make temperature compensation circuits more stable. Digital programmability permits the temperature characteristics of the reference to be controlled by a microprocessor. Such a capability permits sophisticated control algorithms to be implemented in the microprocessor's software, and permits a microprocessor to configure the reference with specific temperature compensation coefficients previously stored in memory.

Many conventional temperature compensation circuits depend on the adjustment of on-chip resistors to achieve the proper variation in the temperature coefficient of a current. These circuits are often geared more for circuit biasing rather than for being a reference. Circuits providing a predetermined temperature coefficient (tempco), absolute accuracy, and computer controllability have been largely unavailable.

It would be advantageous if a temperature compensation circuit could exactly provide a predetermined finite current or voltage temperature coefficient that is relatively constant with respect to temperature.

It would be advantageous if temperature compensation circuitry could be built using digital hardware to exactly provide predetermined outputs. It would also be advantageous if the digital temperature compensation could provide an exact current or voltage coefficient into response to digital control signals.

Accordingly, a temperature compensation circuit is provided comprising a first digital-to-analog (DAC) circuit to source/sink a compensated temperature dependent current which has been proportionally modified from the first temperature dependent current.

A second DAC source/sinks a compensated temperature independent current which has been proportionally modified from a first temperature independent current. In one aspect of the invention, current is sourced by the second port, in a second aspect the current is sunk.

The two compensated currents are summed to provide a reference current which precisely varies to a predetermined temperature coefficient. When a resistive element, having an impedance matching the tempco impedance of the current source, is added to the circuit, a reference voltage having a predetermined temperature coefficient is provided by shunting the reference current across the resistive element.

The first DAC has an input to accept a first digital control signal. The first DAC modifies the flow of the compensated temperature dependent current in response to the first digital control signals. Likewise, second DAC accepts a second digital control signal. The second DAC varies the flow of the compensated temperature independent current in response to the second digital control signal. Typically, the first and second DACs are responsive to n-bits of selectable control.

In the first aspect of the invention, p (the digital control value) varies from 0 to $2^n-1$, and the first and second control lines provide the value p. Then, the compensated currents are proportional to the value of p/N, where $N=2^n-1$. In this first aspect, the first DAC sources the compensated temperature dependent current, and the second DAC sinks the compensated temperature independent current. The reference current is then equal to the first temperature independent current+second temperature dependent current−second temperature independent current.

In the second aspect of the invention, the first control line provides the value p, in which the second control lines provides the value (N−p). Then, the compensated dependent current in proportional to the value of p/N, and the compensated independent current is proportional to the value of (N−p)/N. In this second aspect, the first DAC sources the compensated temperature dependent current, and the second DAC sources the compensated temperature independent current. The reference current is equal to the compensated temperature independent current+compensated temperature dependent current.

A method of temperature compensation is also provided comprising the steps of:

a) generating a first temperature dependent current;

b) generating a first temperature independent current;

c) generating a compensated temperature dependent current selectively proportional to the first temperature dependent current;

d) generating a compensated temperature independent current selectively proportional to the first temperature independent current; and e) in response to Steps c) and d), generating a reference current output which precisely varies to a predetermined temperature coefficient.

Typically, other steps precede Step c), of:

b1) introducing a first control signal; and b2) introducing a second control signal.

Then, Step c) varies the compensated temperature dependent current in response to the first control signal, and Step d) varies the first temperature independent current in response to the second control signal.

Steps b1) and b2) include providing an n-bit first and second control signal, and Steps c) and d) vary the compensated currents over a range of $2^n$ levels. In the first aspect of the invention, the control signals provide a control bit p, the value of which varies from 0 to $2^n-1$. Then, Steps c) and d) include varying the compensated currents in proportion to the value of p/N. The reference current equals the first temperature independent current of Step b)+compensated temperature dependent current of Step c)−compensated temperature independent current of Step d).

In the second aspect of the invention, Step b1) provides the value p, and Step b2) provides the value (N−p). Then, Step c) includes varying the compensated dependent current in proportion to the value of p/N, and Step d) includes varying the compensated independent current in proportion to the value of (N−p)/N. The reference current is equal to the compensated temperature dependent current of Step c)+compensated temperature independent current of Step d).

DETAILED DESCRIPTION OF THE PREFERRED EMBODIMENT

The invention uses DACs (Digital-to-Analog Converters) to proportionally mix temperature independent and temperature dependent currents, respectively, $I_{REFF}$ and $I_{REFTC}$, to form a reference current, $I_{REF}$, with a digitally programmable temperature coefficient (tempco). This programmable current is passed through a resistor and converted to a reference voltage that possess a programmable tempco. The equation governing the mixing of the currents is $$I_{REF} = I_{REFF} + (N_{TC} I_{REFTC}/N_{TCo}) - (N_{TC} I_{REFF}/N_{TCo}) \quad \text{Eq. (1)}$$

where NTC is the decimal setting of an n-bit DAC and $N_{TCo}$ is the decimal range equivalent of the DAC ($N_{TCo} = 2^n - 1$). The above expression describes a situation where there are separate DACs controlling the amount of $I_{REFF}$ and $I_{REFTC}$ current that are being added to the $I_{REF}$ output. However, the bit programming of the individual DACs is identical and given by $N_{TC}$. The $I_{REFF}$ current is defined herein as the first temperature independent current. The $I_{REFTC}$ current is defined herein as first temperature dependent current. The term $I_{REFTC}$ in the above expression is of the form $$I_{REFTC} = I_{REFTCo}(1 + \Delta T \Delta I_{REFTC}) \quad \text{Eq.(2)}$$

where $\Delta T$ is the temperature difference from the absolute reference temperature $T_o$ ($\Delta T = T - T_o$ where T is the absolute temperature), $\Delta I_{REFTC}$ is the fixed temperature coefficient of the temperature dependent reference current, and $I_{REFTCo}$ is the temperature dependent current value at the reference temperature. If it is assumed that $I_{REFTCo} = I_{REFF}$, then Eq. 2 can be substituted into Eq. 1 and the result is $$I_{REF} = I_{REFTCo}(1 + \Delta T \, N_{TC} \Delta I_{REFTC} N_{TCo}). \quad \text{Eq. (3)}$$

As can be seen from this equation, the tempco of the temperature dependent reference can be scaled by the DAC setting to yield a digitally programmable tempco.

Figure 1:
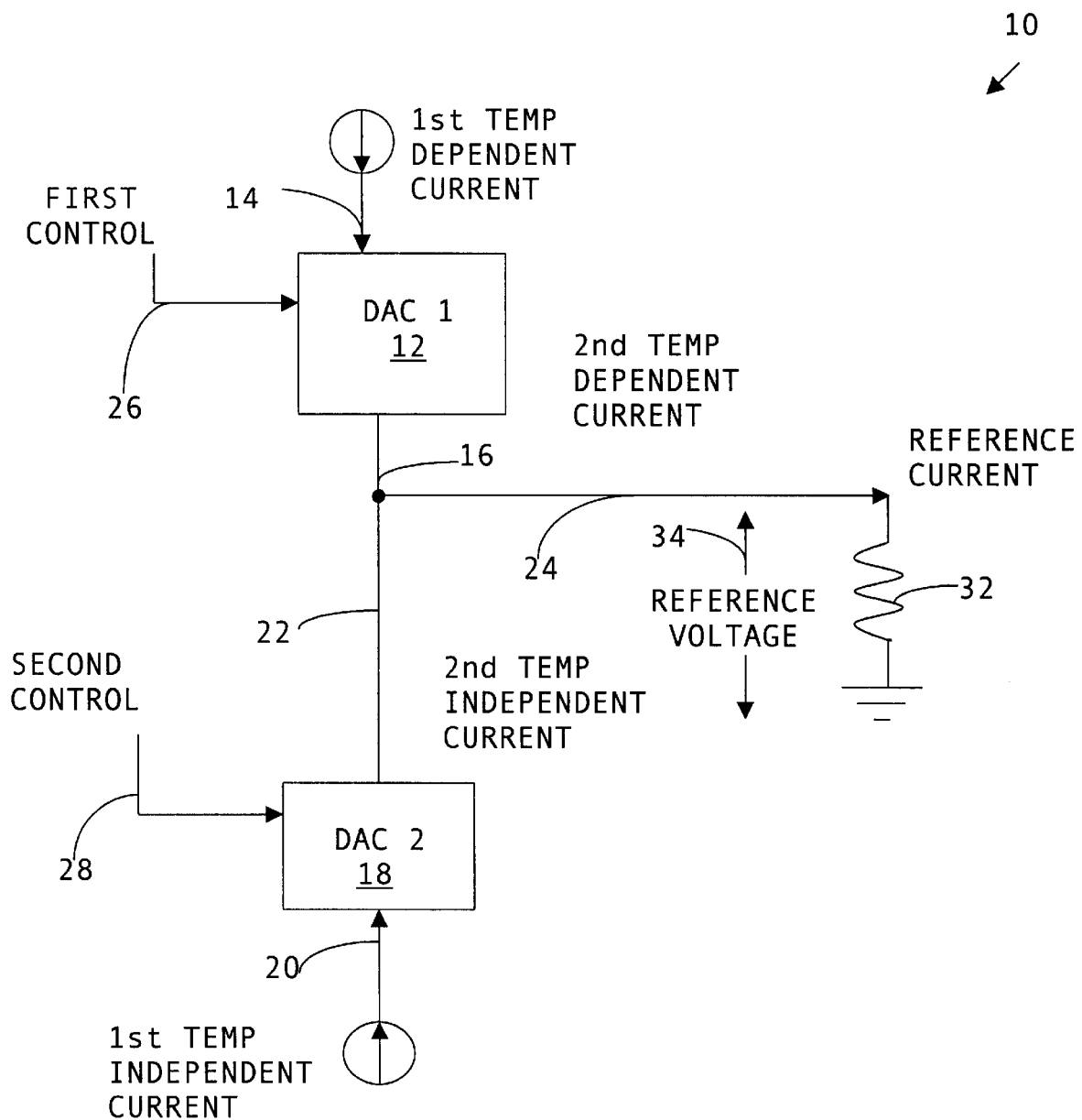
FIG. 1 is a block schematic diagram of the present invention temperature compensation circuit.

FIG. 1 is a block schematic diagram of the present invention temperature compensation circuit. Temperature compensation circuit 10 comprises a first digital-to-analog (DAC) circuit 12 having a first port on line 14 to accept a first temperature dependent current. First DAC 12 has a second port on line 16 to communicate a second temperature dependent current. The second temperature dependent current is selectively proportional to the first temperature dependent current, as is explained below.

A second DAC 18 has a first port on line 20 to accept a first temperature independent current. Second DAC 18 has a second port on line 22 to communicate a second temperature independent current. The second temperature independent current is selectively proportional to the first temperature independent current.

A current output on line 24, operatively connected to the second ports of first DAC 12 and second DAC 18, provides a reference current on line 24 which precisely varies to a predetermined temperature coefficient. In this manner, a precise temperature varying current is provided. With respect to the above equations, the reference current on line 24 is defined as $I_{REF}$.

First DAC 12 includes a third port on line 26 to accept a first digital control signal. First DAC 12 varies the flow of the second temperature dependent current in response to the first digital control signals on line 26. Likewise, second DAC 18 includes a third port on line 28 to accept a second digital control signal. Second DAC 18 varies the flow of the second temperature independent current on line 22 of second DAC 18 in response to the second digital control signal on line 28.

The third ports of first and second DACs 12 and 18, on lines 26 and 28, respectively, are responsive to n-bits of selectable control. That is, control lines 26 and 28 modify the second temperature dependent current on line 16 and the second temperature independent current on line 22, respectively.

Figure 2:
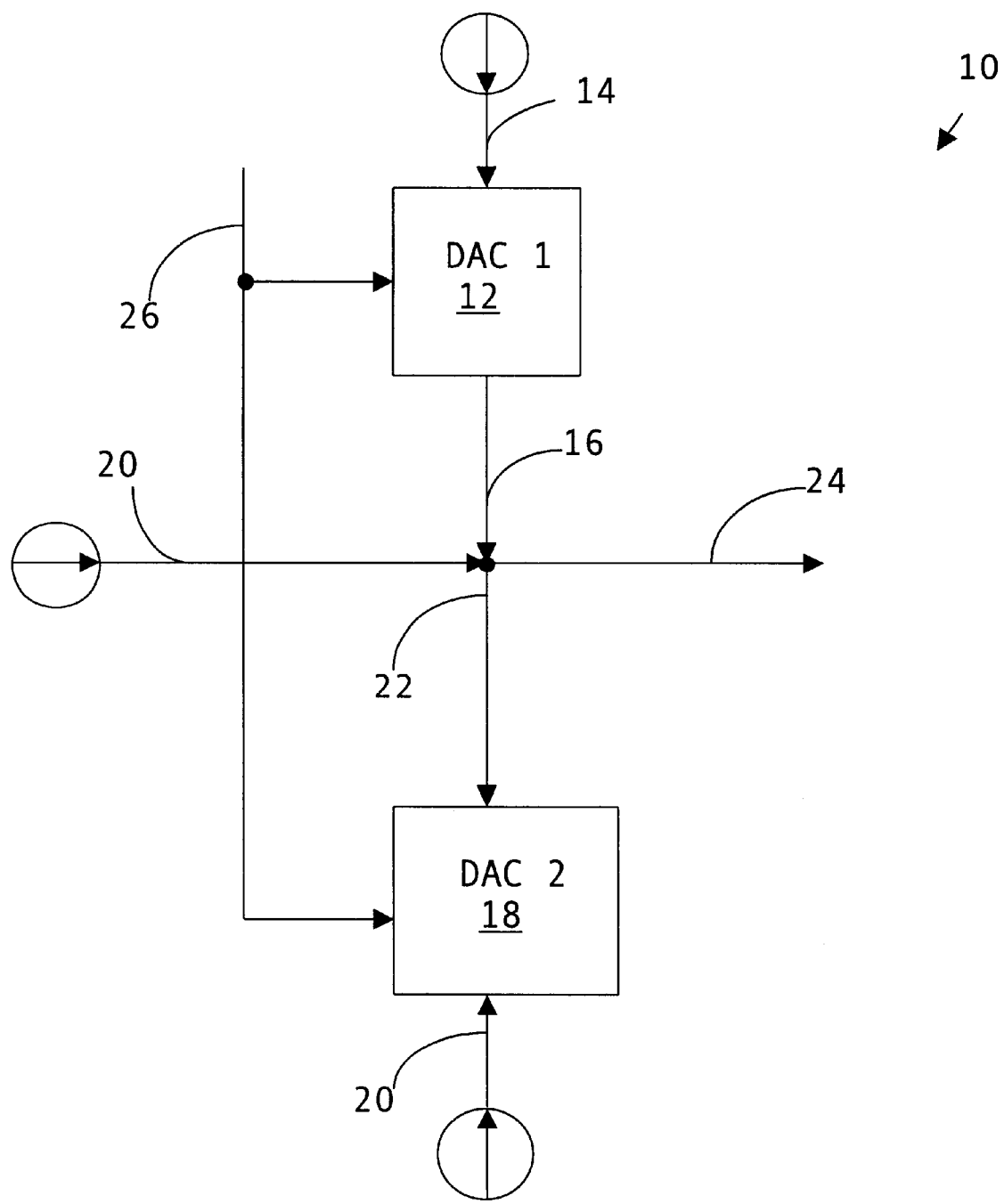
FIG. 2 is a more detailed, first embodiment of the invention depicted in FIG. 1.

FIG. 2 is a more detailed, first embodiment of the invention depicted in FIG. 1. In the embodiment of FIG. 2 it is given that the value p varies from 0 to $2^n - 1$, and that first and second control lines 26 provide the value p. Since first and second controls lines 26 and 28 (see FIG. 1) are the same, they are both called first control line 26 in FIG. 2. The second dependent current on line 16 is proportional to the value of p/N, where $N = 2^n - 1$, and that the second independent current on line 22 is proportional to the value of p/N. In terms of Eq. 1, the second temperature dependent current is expressed as $(N_{TC} \cdot I_{REFTC}/N_{TCo})$. In terms of Eq. 1, the second temperature independent current is expressed as $(N_{TC} \cdot I_{REFF}/N_{TCo})$.

In the embodiment of FIG. 2, first DAC 16 sources the second temperature dependent current at the second port on line 16, and second DAC 18 accepts, or sinks the second temperature independent current at the second port on line 22. The reference at current output 24 is equal to the following:

first temperature independent current ($I_{REFF}$) on line 20+second temperature dependent current (($N_{TC} \cdot I_{REFTC}$)/

$N_{TCo}$)) on line 16—second temperature independent current (($N_{TC} \cdot I_{REFF}$)/$N_{TCo}$) on line 22.

Figure 3:
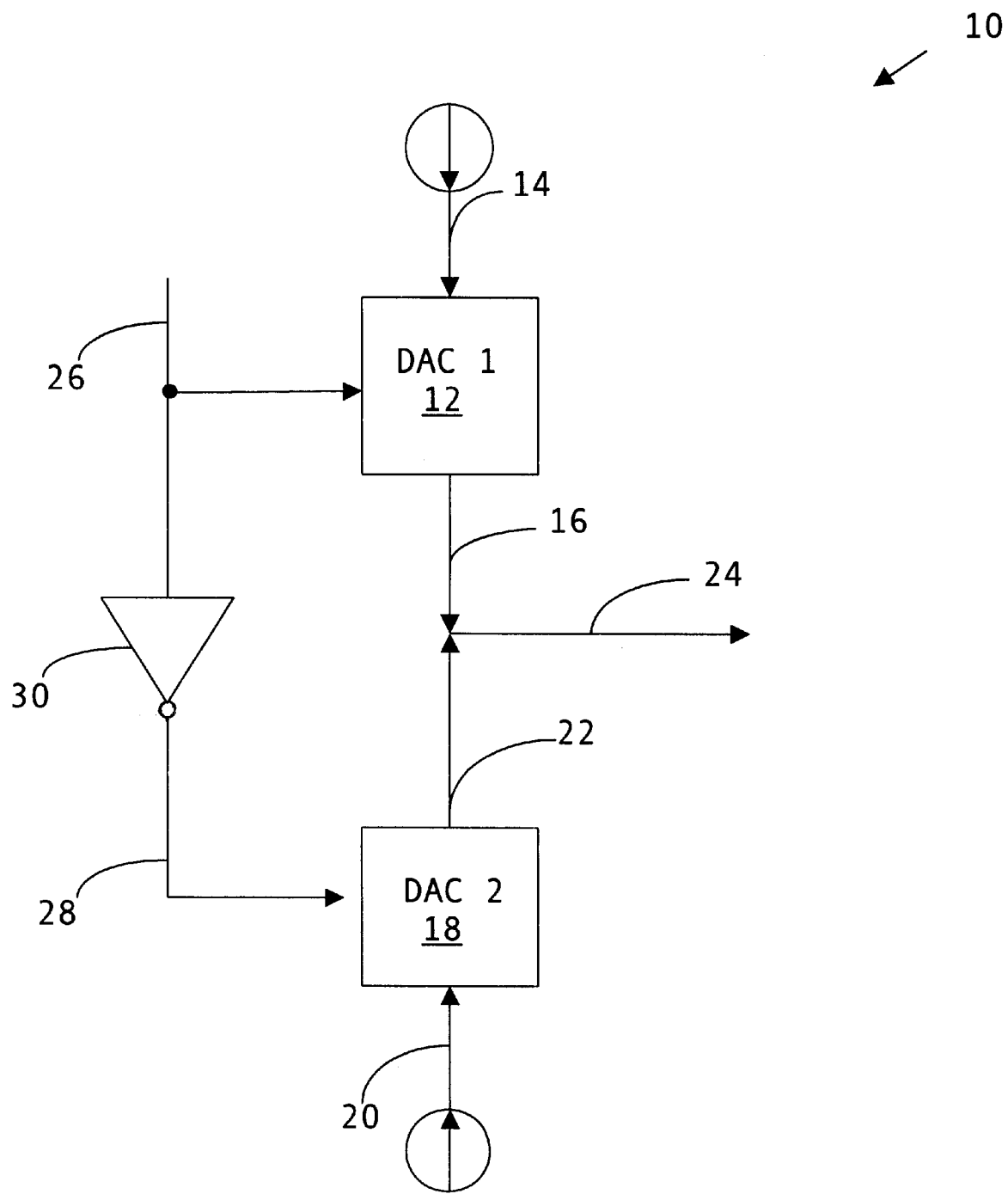
FIG. 3 is a more detailed, second embodiment of the invention depicted in FIG. 1.

FIG. 3 is a more detailed, second embodiment of the invention depicted in FIG. 1. It is given that p varies from 0 to $2^n-1$. When first control line 26 provides the value p, second control line 28 provides the value (N−p). That is, second control line 28 is the inverse of first control line 26. Then, the second dependent current on line 16 in proportional to the value of p/N, and the second independent current on line 22 is proportional to the value of (N−p)/N.

The circuit of FIG. 3 is derived by recasting Eq. 1, pre-forming the difference term such that $$I_{REF}=(N_{TC}I_{REFTC}/N_{TCo})+(N_{TCo}-N_{TC})I_{REFF}/N_{TCo} \quad \text{Eq. (4)}$$

In the embodiment of FIG. 3, first DAC 12 sources the second temperature dependent current at the second port on line 16, and second DAC 18 sources the second temperature independent current at the second port on line 22. Then, the reference current on line 24 is equal to the following:

second temperature dependent current (($N_{TC} \cdot I_{REFTC}$)/$N_{TCo}$)) on line 16+second temperature independent current ((($N_{TCo}-N_{TC}) \cdot I_{REFF}$)/$N_{TCo}$) on line 22.

In terms of Eq. 4, the second temperature dependent current is expressed as ($N_{TC} \cdot I_{REFTC}/N_{TCo}$). In terms of Eq. 4, the second temperature independent current is expressed as (($N_{TCo}-N_{TC}) \cdot I_{REFF}$)/$N_{TCo}$).

Temperature compensation circuit 10 of FIG. 3 further comprises an inverter circuit 30 having a first input to accept the first control signal on line 26. A first output on line 28 is operatively connected to the third port of second DAC 18, to provide the second control signal. That is, a series of digital inverters 30 are used to invert the DAC control signals to operate the DACs in a complementary fashion (i.e., at one extreme of the DAC control settings all the reference current is derived from one DAC, whereas it is derived solely from the other DAC at the other extreme setting). The outputs of the DACs 12 and 18 are then summed to form the $I_{REF}$ current, or the reference current output 24.

Returning to FIG. 1, current output 24, providing the reference current, has a reference impedance with a predetermined temperature coefficient. Temperature compensation circuit 10 further comprises an impedance device 32 with impedance temperature coefficient matching the reference impedance of current output 24. Impedance device 32 has a first input operatively connected to current output on line 24 to accept the reference current. Impedance device 32 has a voltage output, represented by reference designator 34, to provide a reference voltage which precisely varies to a predetermined finite temperature coefficient.

Those familiar with the art can conceive of a number of different means to implement the circuit derived from Eq. 1. FIGS. 2 and 3 are intended merely as examples of circuits that can be derived for Eq. 1. Alternately stated, temperature compensation circuit 10 comprises a means for generating a compensated temperature dependent current 16 selectively proportional to a first temperature dependent current, in response to a first digital command. Temperature compensation circuit 10 includes a means for generating a compensated temperature independent current 22 selectively proportional to the first temperature independent current, in response to a second digital command. Further, circuit 10 comprises a means for summing the compensated temperature independent current and the compensated temperature dependent current to provide a reference current 24 which precisely varies to a predetermined finite temperature coefficient.

With respect to FIG. 2, wherein p varies from 0 to $2^n-1$, and the first and second digital commands on line 26 provide the value p, compensated temperature dependent current generator means 12 provides a compensated temperature dependent current that is proportional to the value of p/N. Compensated temperature independent current generator means 18 sinks a compensated temperature independent current that is proportional to the value of p/N.

With respect to FIG. 3, wherein p varies from 0 to $2^n-1$, the first digital command on line 26 provides the value p, and the second digital command on line 28 provides the value (N−p). Compensated temperature dependent current generator means 12 provides a compensated temperature dependent current that is proportional to the value of p/N. Compensated temperature independent current generator means 18 provides a compensated temperature independent current that is proportional to the value of (N−p)/N.

The exact choice of $I_{REFF}$ and $I_{REFTC}$ depend on the details of the DAC implementation chosen, and the design goals (i.e. the desired tempco and current magnitude range, etc.). In any case, a temperature independent and a temperature dependent current with a fixed tempco are required. One means of generating such currents is a standard bandgap circuit, which generates a temperature independent voltage (VBG), and a proportional to absolute temperature (PTAT) current. The temperature independent current can be derived by forcing the temperature independent bandgap voltage onto a resistor and extracting a current. Similarly, this current can be proportionally summed with the PTAT current and run through another resistor to generate a fixed tempco voltage, VTC. In turn, VTC can be forced across yet another resistor and a current extracted to act as the fixed tempco current.

Figure 4:
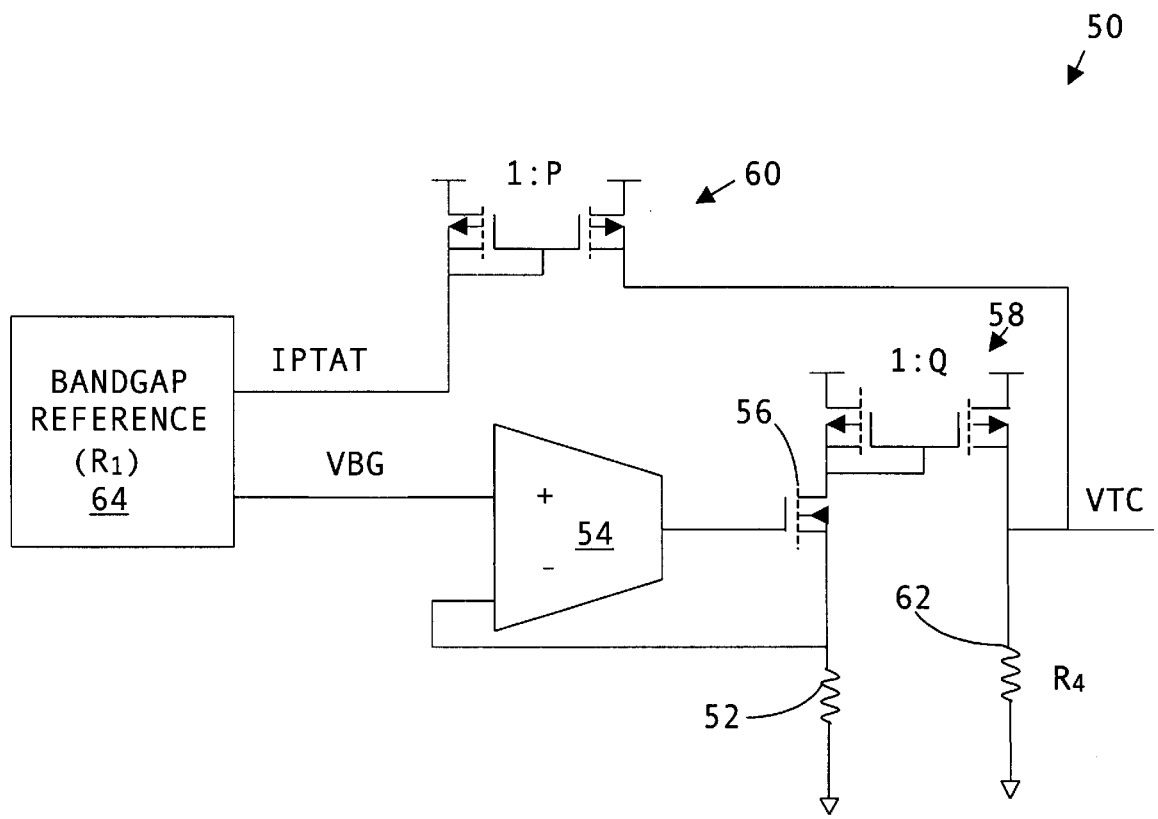
FIG. 4 illustrates an exemplary bandgap circuit useful in creating temperature dependent voltage reference, VTC.

FIG. 4 illustrates an exemplary bandgap circuit 50 useful in creating temperature dependent voltage reference, VTC. The bandgap voltage, VBG, is forced across resistor $R_3$ (52) by the combination of an OTA (operational transconductance amplifier) 54 and an n-channel follower 56. Numerous other means exist to accomplish this same task. The current is extracted by means of the p-channel current mirror 58. This current mirror modifies the current magnitude by a factor Q. Similarly, the PTAT current, IPTAT, is extracted from the bandgap circuit by means of another p-channel current mirror 60. Current mirror 60 modifies the PTAT current by a gain of P. The outputs of current mirrors 58 and 60 are added and converted back to a voltage VTC by resistor $R_4$ (62). The resulting voltage is described by the equation $$VTC=(\pm Q\ VBG\ R_4/R_3 + P\ R_4 kT_o \ln(m)/q\ R_1)(1+\Delta T \Delta VTC) \quad \text{Eq. (5)}$$

where the tempco is given by $$\Delta VTC=(P\ R_4 k1n(m)/q\ R_1)/(\pm Q\ VBG\ R_4/R_3 + P\ R_4\ kT_o \ln(m)/q\ R_1)\text{Eq.}(6)$$

In these equations k is the Boltzmann constant, q is the charge of an electron, m is the bandgap diode ratio, and $R_1$ (64) is the bandgap reference resistor. The ±-sign on the fixed current term implies that, depending on the design goals, it may be desirable to add or subtract this current from the VTC node. All the resistors in this circuit would generally be implemented on-chip for matching purposes. Their ratios, as well as the P and Q ratios, can be manipulated by the designer to achieve the desired design goal.

Another means to generate a reference voltage with a programmable tempco would be to manipulate the resistor or current mirror ratios by the use of DACs (not shown).

However, due to the odd ratios that must be accommodated for certain design goals, this is not always the most convenient approach. Turning back to the implementation of FIG. 4, it is possible to generate a reference current with a fixed tempco by forcing VTC across a resistor. This current, as well as the temperature independent current, can then be scaled and supplied as reference currents, $I_{REFF}$ and $I_{REFTC}$, to the DACs described at the beginning of this section.

In situations where an accurate current with a programmable tempco is the desired result, it is most effective that VTC and VBG be forced across low tempco precision resistors (either on-chip or off) to derive the reference current for the DACs. Alternatively, in the situation where an accurate reference voltage with a programmable tempco is the desired result, it is most effective that VTC and VBG be forced across on-chip resistors to derive the reference currents for the DACs. The output of the DACs can be converted back to a voltage by forcing the DAC output through a similar scaled on-chip resistor. Similarly, all low-tempco off-chip resistors could be used. Circuits similar to what is shown in FIG. 4 can be used to force the reference voltages across resistors for the purpose of extracting a proportional current.

Figure 5:
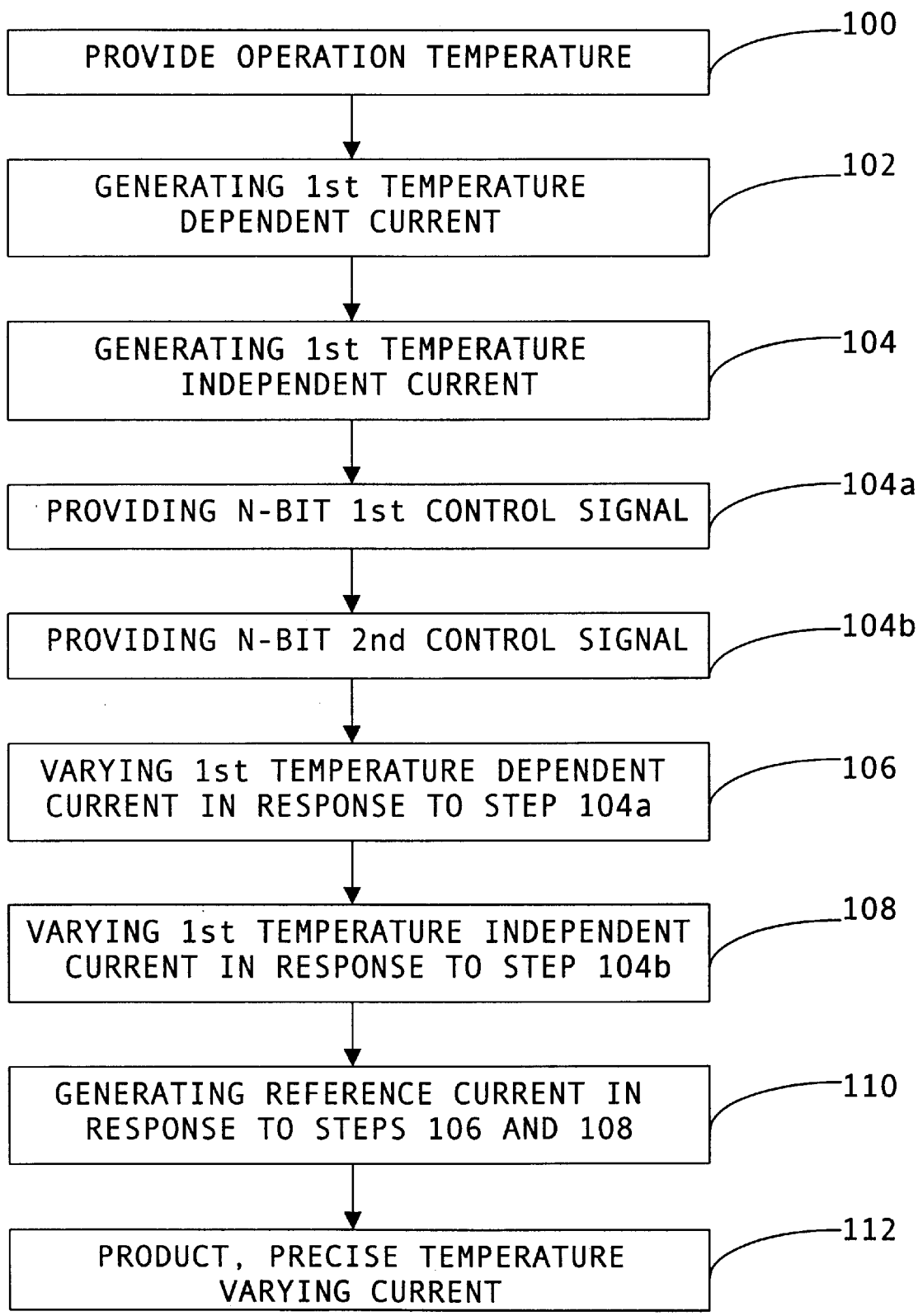
FIG. 5 is a flowchart illustrating the present invention method for providing temperature compensation.

FIG. 5 is a flowchart illustrating the present invention method for providing temperature compensation. Step 100 provides a temperature of operation. Step 102 generates a first temperature dependent current. Step 104 generates a first temperature independent current. Step 106 communicates a second temperature dependent current selectively proportional to the first temperature dependent current of Step 102. Step 108 communicates a second temperature independent current selectively proportional to the first temperature independent current of Step 104. Step 110, in response to Steps 106 and 108 generates a reference current output which precisely varies to a predetermined temperature coefficient. Step 112 is a product, where a precise temperature varying current is provided.

In some aspects of the invention, further steps precede Step 106. Step 104a introduces a first control signal, and Step 104b introduces a second control signal. Step 106 includes varying the first temperature dependent current in response to the first control signal, to communicate the second temperature dependent current. Step 108 includes varying the first temperature independent current in response to the second control signal, to communicate the second temperature independent current.

Step 104a and 104b provide an n-bit first and second control signal. Then, Steps 106 and 108 include linearly varying the first temperature independent current and first temperature dependent current over a range of $2^n$ levels.

In one aspect of the invention, Step 100 provides that p varies from 0 to $2^n-1$. Steps 104a and 104b include and the first and second control lines providing the value p. Then, Step 106 includes the second dependent current varying in proportional to the value of p/N, and Step 108 includes the second independent current varying in proportional to the value of p/N. Thus, Step 110 includes the reference current output being equal to the following:

first temperature independent current of Step 104+second temperature dependent current of Step 106−second temperature independent current of Step 108.

In a second aspect of the invention, Step 100 provides that p varies from 0 to $2^n-1$. Then, Step 104a includes the first control line providing the value p, and Step 104b includes the second control lines providing the value (N−p). Step 106 includes the second dependent current being proportional to the value of p/N, and Step 108 includes the second independent current being proportional to the value of (N−p)/N. Thus, Step 110 includes the reference current output being equal to the following:

second temperature dependent current of Step 106+ second temperature independent current of Step 108.

With respect to the second aspect of the invention, a further step optionally follows Step 104a, and precedes Step 104b. Step 104a1 inverts the first control signal. Then, Step 104b includes introducing the inverted first control signal as the second control signal.

In some aspects of the invention a further step follows Step 110. Step 110b (not shown) generates a reference voltage which precisely varies to a predetermined temperature coefficient. Optionally, Step 110 includes providing the reference output current at a reference impedance having a predetermined temperature coefficient. Step 110a (not shown) introduces the reference output current to an impedance having a temperature coefficient matching the reference impedance. Then, Step 100b includes generating the reference voltage in response to Step 100a.

A system and method of providing a precise, programmable temperature coefficient, in the form of either current or voltage, has been provided. Temperature independent and temperature dependent current are manipulated through the use of DACs, with the sum of these currents representing the desired coefficient. The DACs are digitally programmable to provide the exact current required to meet a predetermined temperature coefficient. Electrical components requiring temperature compensation can be precisely controlled by supplying current at a known, predetermined temperature coefficient. Other variations and embodiments of the circuits and processes described above will occur the those skilled in the art.

What is claimed is:

1. A temperature compensation circuit comprising:
   a first digital-to-analog (DAC) circuit having a first port to accept a first temperature dependent current, and a second port to communicate a second temperature dependent current selectively proportional to the first temperature dependent current;
   a second DAC having a first port to accept a first temperature independent current, a second port to communicate a second temperature independent current selectively proportional to the first temperature independent current; and
   a current output, operatively connected to the second port of said first and second DACs, providing a reference current which precisely varies to a predetermined temperature coefficient, whereby a precise temperature varying current is provided.

2. The temperature compensation circuit of claim 1 in which said first DAC includes a third port to accept a first digital control signal, said first DAC varying the flow of the second temperature dependent current in response to the first digital control signals, and in which said second DAC includes a third port to accept a second digital control signal, said second DAC varying the flow of the second temperature independent current of said second DAC in response to the second digital control signal.

3. The temperature compensation circuit of claim 2 in which the third ports of said first and second DACs are responsive to n-bits of selectable control over the second temperature dependent current and second temperature independent current, respectively.

4. The temperature compensation circuit of claim 3 wherein p varies from 0 to $2^n-1$, in which said first and second control lines provide the value p, in which the second dependent current is proportional to the value of p/N, where $N=2^n-1$, and in which the second independent current is proportional to the value of p/N.

5. The temperature compensation circuit of claim 4 wherein said first DAC sources the second temperature dependent current at the second port, wherein said second DAC accepts the second temperature independent current at the second port, and in which the reference current at said current output is equal to the following:

first temperature independent current ($I_{REFF}$)+second temperature dependent current (($N_{TC} \cdot I_{REFTC})/N_{TCo}$))−second temperature independent current (($N_{TC} \cdot I_{REFF})/N_{TCo}$).

6. The temperature compensation circuit of claim 3 wherein p varies from 0 to $2^n-1$, in which the first control line provides the value p, in which the second control line provides the bit (N−p), in which the second dependent current is proportional to the value of p/N, where $N=2^n-1$, and in which the second independent current is proportional to the value of (N−p)/N.

7. The temperature compensation circuit of claim 6 wherein said first DAC sources the second temperature dependent current at the second port, wherein said second DAC sources the second temperature independent current at the second port, and in which the reference current at said current output is equal to the following:

second temperature dependent current (($N_{TC} \cdot I_{REFTC})/N_{TCo}$))+second temperature independent current ((($N_{TCo}-N_{TC}) \cdot I_{REFF})/N_{TCo}$).

8. The temperature compensation circuit of claim 6 further comprising:

an inverter circuit having a first input to accept the first control signal and having a first output, operatively connected to the third port of said second DAC, to provide the second control signal.

9. The temperature compensation circuit of claim 1 in which said current output, providing the reference current, has a reference impedance with a predetermined temperature coefficient, and further comprising:

an impedance device with impedance temperature coefficient matching the reference impedance of said current output, said impedance device having a first input operatively connected to said current output to accept the reference current, and having a voltage output to provide a reference voltage which precisely varies to a predetermined finite temperature coefficient.

10. A temperature compensation circuit comprising:

a means for communicating a compensated temperature dependent current selectively proportional to a first temperature dependent current, in response to a first digital command;

a means for communicating a compensated temperature independent current selectively proportional to the first temperature independent current, in response to a second digital command; and a means for summing the compensated temperature independent current and the compensated temperature dependent current to provide a reference current which precisely varies to a predetermined finite temperature coefficient.

11. The temperature compensation circuit of claim 10 wherein p varies from 0 to $2^n-1$, and the first and second digital commands provide the value p, in which the compensated temperature dependent current generator means provides a compensated temperature dependent current that is proportional to the value of p/N, where $N=2^n-1$, and in which the compensated temperature independent current generator means sinks a compensated temperature independent current that is proportional to the value of p/N.

12. The temperature compensation circuit of claim 10 wherein p varies from 0 to $2^n-1$, with the first digital command provide the value p, and the second digital command providing the value (N−p), where $N=2^n-1$, in which the compensated temperature dependent current generator means provides a compensated temperature dependent current that is proportional to the value of p/N, and in which the compensated temperature independent current generator means provides a compensated temperature independent current that is proportional to the value of (N−p)/N.

13. A method of providing temperature compensation comprising the steps of:

a) generating a first temperature dependent current;

b) generating a first temperature independent current;

c) communicating a second temperature dependent current selectively proportional to the first temperature dependent current of Step a);

d) communicating a second temperature independent current selectively proportional to the first temperature independent current of Step b); and e) in response to Steps c) and d), generating a reference current output which precisely varies to a predetermined temperature coefficient, whereby a precise temperature varying current is provided.

14. The method as in claim 13 further comprising steps, preceding Step c), of:

b1) introducing a first control signal;

b2) introducing a second control signal;

in which Step c) includes varying the first temperature dependent current in response to the first control signal, to communicate the second temperature dependent current; and in which Step d) includes varying the first temperature independent current in response to the second control signal, to communicate the second temperature independent current.

15. The method as in claim 14 in which Steps b1) and b2) include providing an n-bit first and second control signal, in which Steps c) and d) including linearly varying the first temperature dependent current and first temperature independent current over a range of $2^n$ levels.

16. The method as in claim 15 wherein p varies from 0 to $2^n-1$, in which Step b1) includes the first control line providing the value p, in which Step b2) includes the second control lines providing the value (N−p), where $N=2^n-1$, in which Step c) includes the second dependent current being proportional to the value of p/N, and in which Step d) includes the second independent current being proportional to the value of (N−p)/N.

17. The method as in claim 16 in which Step e) includes the reference current output being equal to the following:

second temperature dependent current (($N_{TC} \cdot I_{REFTC})/N_{TCo}$))+second temperature independent current ((($N_{TCo}-N_{TC}) \cdot I_{REFF})/N_{TCo}$).

18. The method as in claim 17 comprising a further step, following Step b1), and preceding Step b2), of:

b1a) inverting the first control signal; and in which Step b2) includes introducing the inverted first control signal as the second control signal.

19. The method as in claim 15 wherein p varies from 0 to $2^n-1$, in which Steps b1) and b2) include and the first and second control lines providing the value p, in which Step c)

includes the second dependent current varying in proportional to the value of p/N, where $N=2^n-1$, and in which Step d) includes the second independent current varying in proportional to the value of p/N.

20. The method as in claim 19 in which Step e) includes the reference current output being equal to the following:

first temperature independent current ($I_{REFF}$)+second temperature dependent current (($N_{TC} \cdot I_{REFTC})/N_{TCo}$))−second temperature independent current (($N_{TC} \cdot I_{REFF}$)/$N_{TCo}$).

21. The method as in claim 13 further comprising the step, following Step e), of:

f) generating a reference voltage which precisely varies to a predetermined temperature coefficient.

22. The method as in claim 21 in which Step e) includes providing the reference output current at a reference impedance having a predetermined temperature coefficient, and comprising the step, preceding Step f), of:

e1) introducing the reference output current to an impedance having a temperature coefficient matching the reference impedance; and in which Step f) includes generating the reference voltage in response to Step e1).

* * * * *